United States Patent
Lai et al.

(10) Patent No.: US 7,540,636 B2
(45) Date of Patent: Jun. 2, 2009

(54) HEAT DISSIPATING LIGHT EMITTING DIODE MODULE HAVING FASTENED HEAT SPREADER

(75) Inventors: Cheng-Tien Lai, Taipei Hsien (TW); Zhi-Yong Zhou, Shenzhen (CN); Qiao-Li Ding, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 167 days.

(21) Appl. No.: 11/617,117

(22) Filed: Dec. 28, 2006

(65) Prior Publication Data

US 2008/0158885 A1    Jul. 3, 2008

(51) Int. Cl.
*B60Q 1/06* (2006.01)
(52) U.S. Cl. .................. 362/373; 361/801; 439/56; 165/104.26; 165/104.33; 362/800
(58) Field of Classification Search .............. 362/294, 362/218, 373, 800, 547, 264, 345, 646, 652, 362/580; 257/99, 718, E33.058, E23.101, 257/373, 675; 361/687, 698–702, 801, 802, 361/759; 165/80.4, 80.5, 104.21, 104.26; 174/252, 260; 439/56; 313/500, 512, 11
See application file for complete search history.

(56) References Cited

U.S. PATENT DOCUMENTS

| 6,517,221 B1 * | 2/2003 | Xie | 362/373 |
| 7,144,140 B2 * | 12/2006 | Sun et al. | 362/373 |
| 2007/0041220 A1 * | 2/2007 | Lynch | 362/646 |
| 2007/0201232 A1 * | 8/2007 | Chen | 362/294 |
| 2007/0285926 A1 * | 12/2007 | Maxik | 362/294 |

FOREIGN PATENT DOCUMENTS

| JP | 2005317480 A | * 11/2005 |
| TW | M294005 | 7/2006 |

OTHER PUBLICATIONS

English Abstract of Japanese Publication JP 2005317480 A.*

* cited by examiner

*Primary Examiner*—Anabel M Ton
*Assistant Examiner*—Kevin Spinella
(74) *Attorney, Agent, or Firm*—Frank R. Niranjan

(57) ABSTRACT

An LED module includes a housing component, a frame holding an LED thereon and covered by the housing component, a fastener located in and secured to the housing component, a heat spreader located in the fastener and secured to the fastener and a heat transfer member having a heat-dissipating unit remote from the LED and a heat pipe thermally connecting with the heat spreader, the LED and the heat-dissipating unit. The housing component tightly presses the frame on the fastener to make a close contact between the heat pipe and the frame. The heat pipe transfers heat from the LED to the heat spreader and the heat-dissipating unit. The heat spreader and the heat-dissipating unit each have a large heat-dissipating surface, whereby the heat generated by the LED can be quickly dissipated by the heat spreader and the heat-dissipating unit.

8 Claims, 5 Drawing Sheets

HEAT DISSIPATING LIGHT EMITTING DIODE MODULE HAVING FASTENED HEAT SPREADER

BACKGROUND OF THE INVENTION

1. Field of the Invention

The present invention relates to a light emitting diode module, more particularly to a light emitting diode module having a thermal management component for removing heat from the light emitting diode.

2. Description of Related Art

A light emitting diode (LED) is a device for transforming electricity into light. When a current flows through a junction comprising two different semiconductors, electrons and holes combine to generate light. LEDs are small, inexpensive, with low power requirements and an extremely long working lifetime under specific conditions; more and more LED modules with different capabilities are being developed.

Generally, LED modules for use in a display or an illumination device require many LEDs, and most of the LEDs are used at the same time, which results in a quick rise in temperature of the LED modules. While, the LEDs are sensitive to temperature and may be permanently damaged by excessive temperatures. High temperature performance of LEDs is an adverse aspect of LED technology that has not been satisfactorily resolved.

Since most LED modules do not have thermal management component with good heat dissipation qualities, operation of the general LED modules are often erratic and unstable because of the rapid build up of heat.

What is needed, therefore, is an LED module having a thermal management component having a sufficient heat removal capability.

SUMMARY OF THE INVENTION

An LED module having a thermal management component is provided. The LED module includes a housing component, a frame holding an LED thereon and covered by the housing component, a fastener located in and secured to the housing component, a heat spreader located in the fastener and secured to the fastener and a heat transfer member having a heat-dissipating unit remote from the LED and a heat pipe thermally connecting with the heat spreader, the LED and the heat-dissipating unit. The housing component cooperates with the heat spreader to tightly press the frame on the fastener to make a close contact between the heat transfer member and the frame. The heat transfer member thermally connects the heat spreader and transfers heat from the LED. The heat spreader and the heat transfer member each have a large heat-dissipating surface in comparison with the LED, whereby the heat generated by the LED can be quickly dissipated by the heat spreader and the heat transfer member.

Other advantages and novel features will become more apparent from the following detailed description of preferred embodiments when taken in conjunction with the accompanying drawings, in which:

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
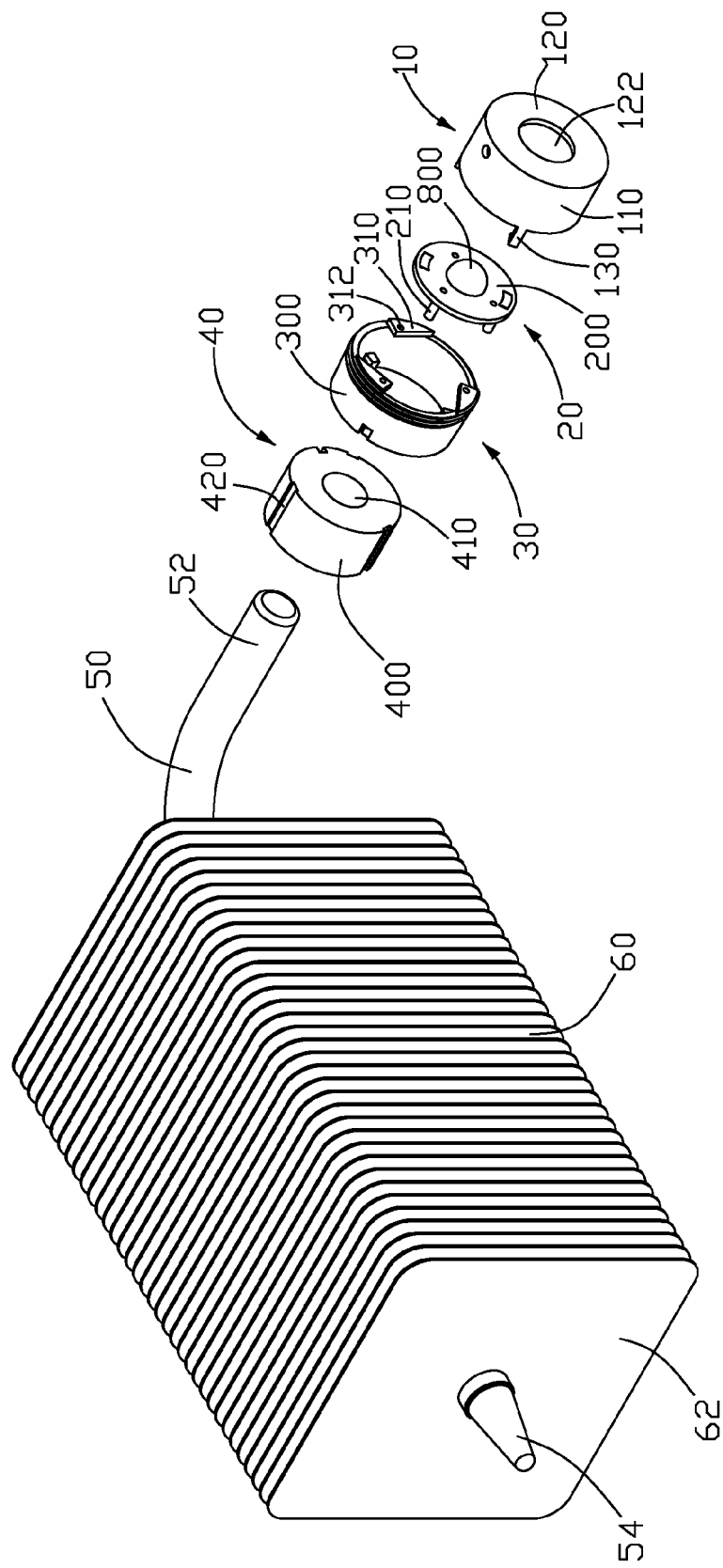
FIG. 1 is an exploded, schematic view of an LED module in accordance with a preferred embodiment of the present invention.
Figure 2:
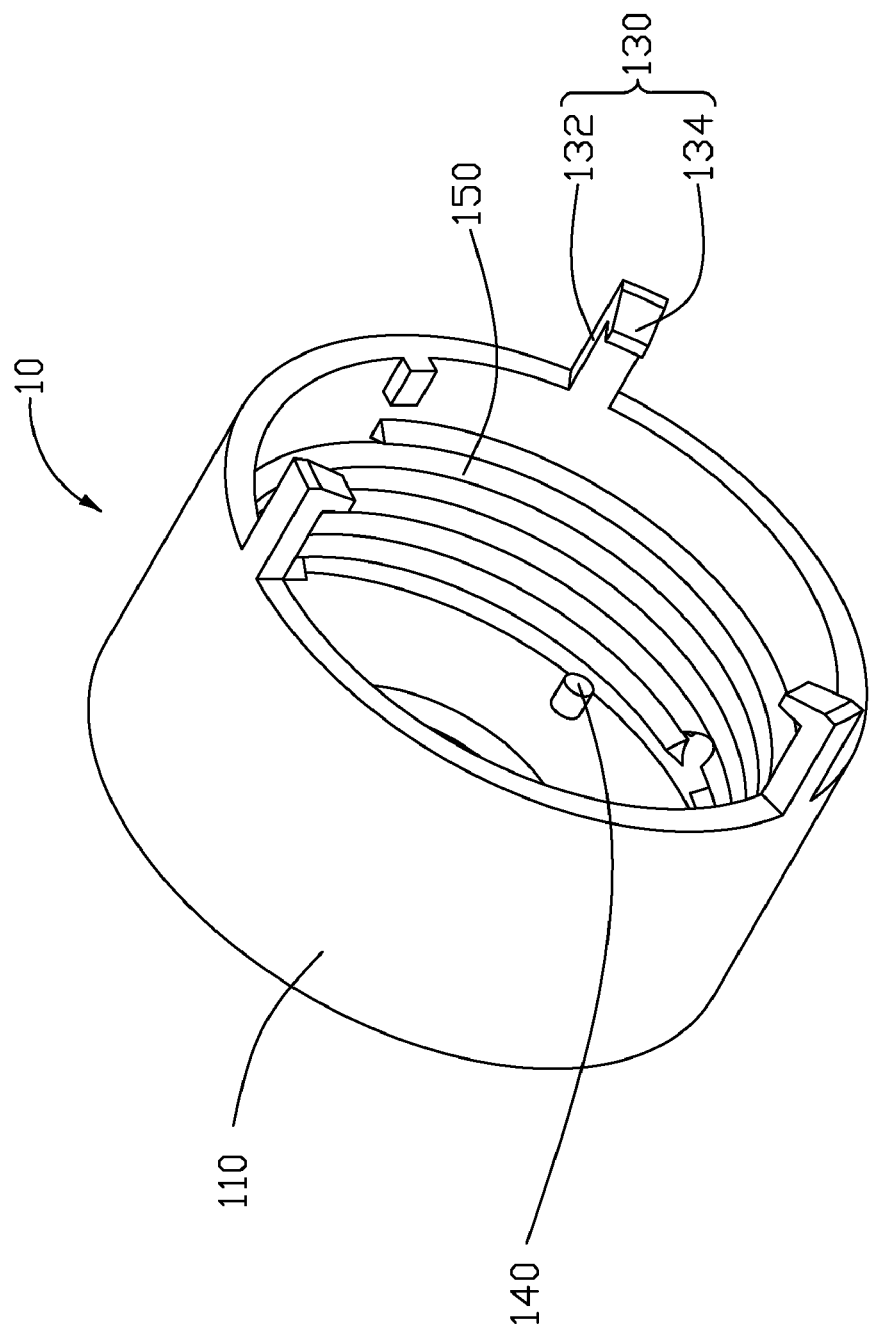
FIG. 2 is an enlarged view of a housing component of FIG. 1, viewed from an opposite aspect.
Figure 3:
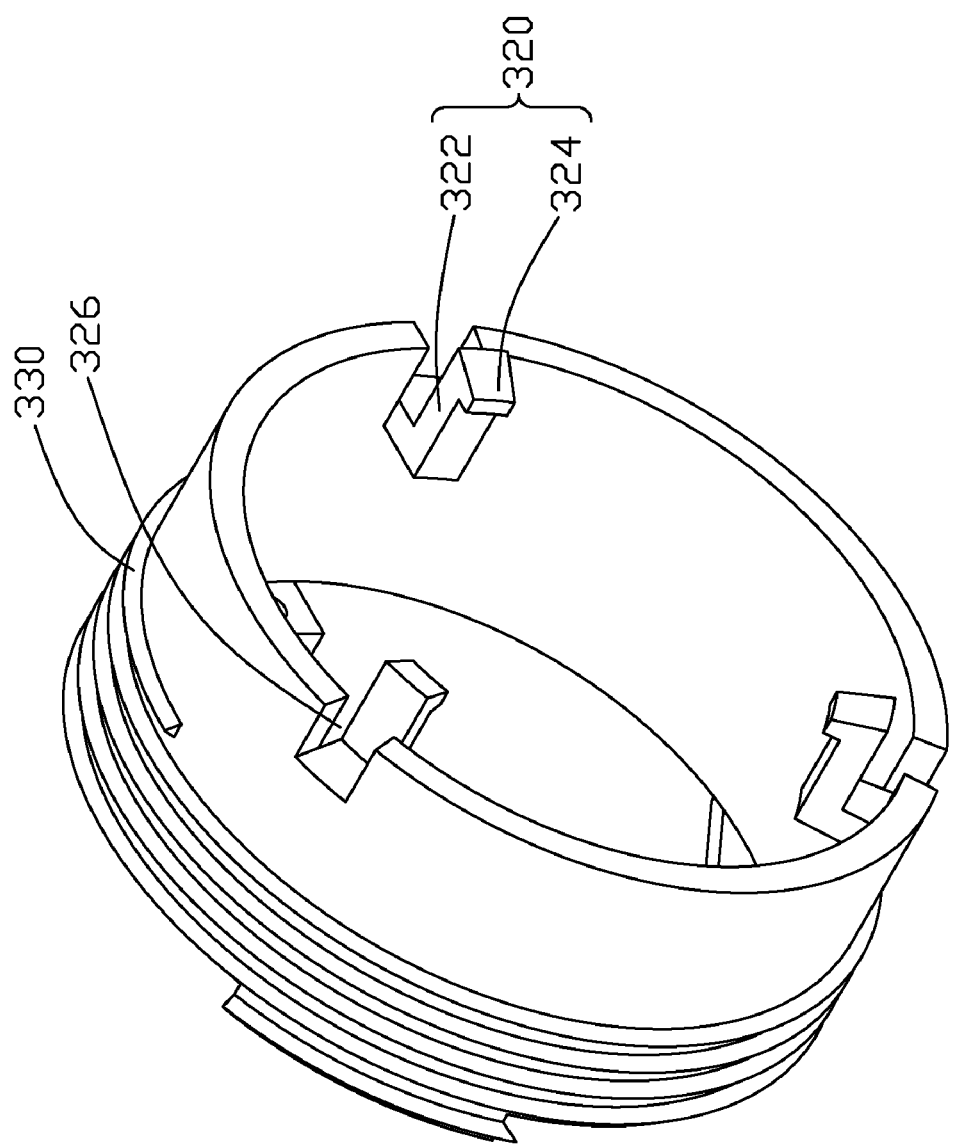
FIG. 3 is an enlarged view of a fastener of FIG. 1, viewed from an opposite aspect.
Figure 4:
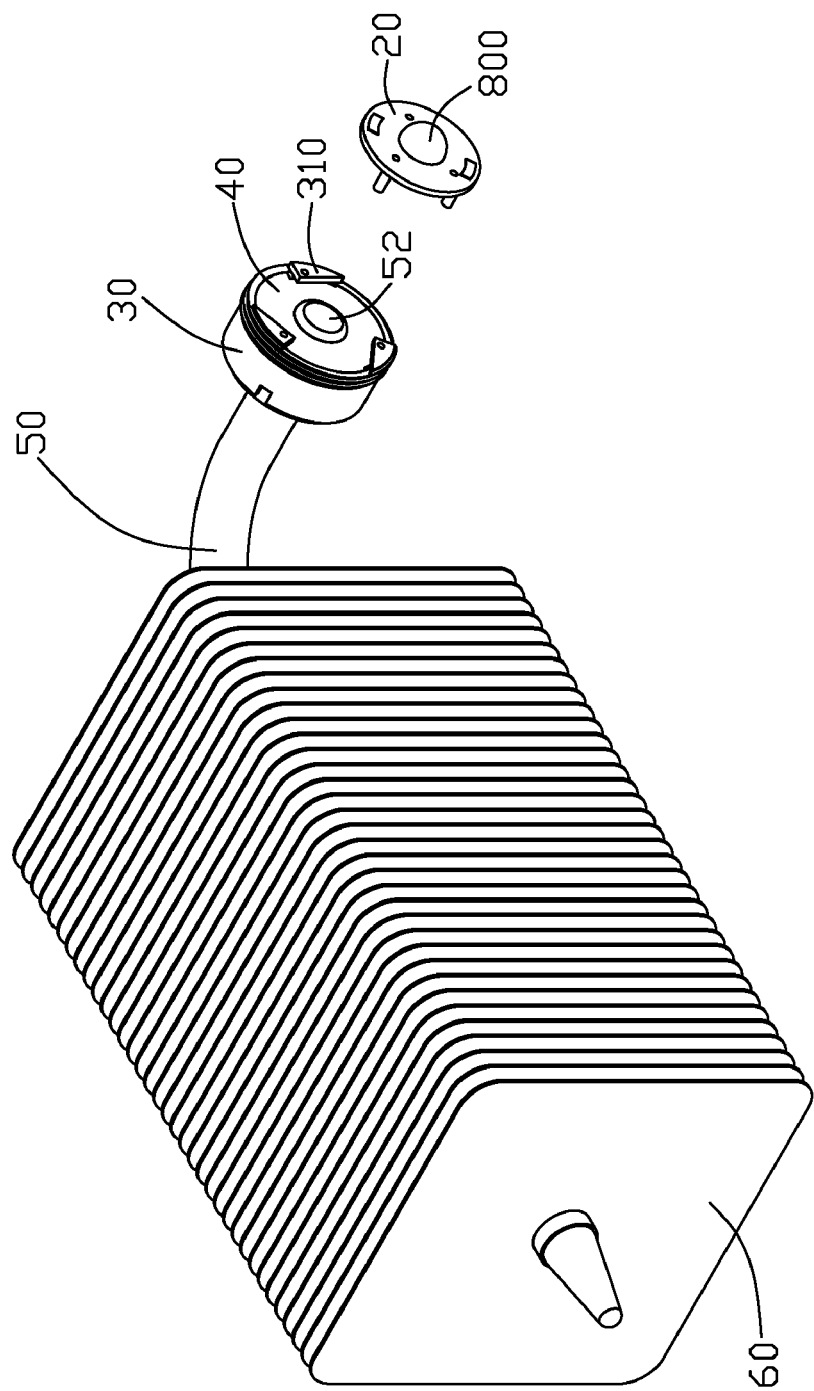
FIG. 4 is a partially assembled view of FIG. 1.
Figure 5:
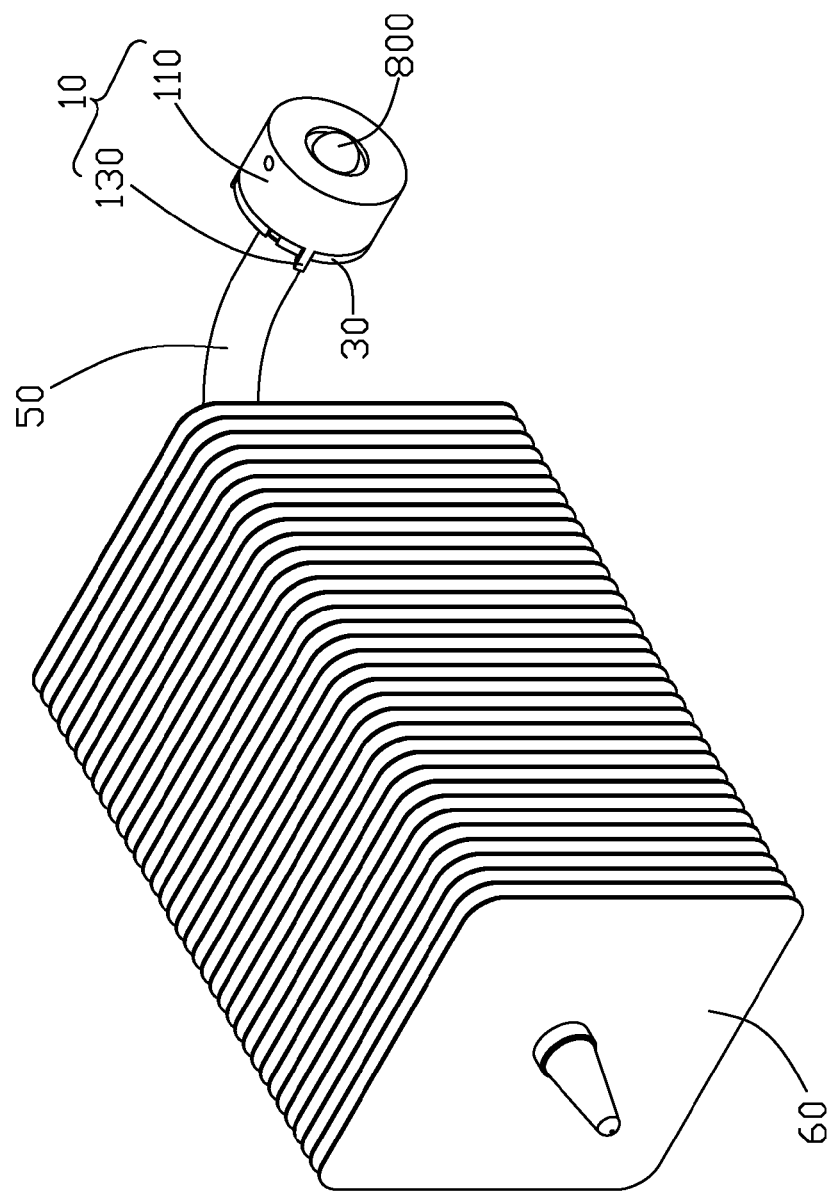
FIG. 5 is an assembled view of FIG. 1.

Referring to FIGS. 1-5, an LED module in accordance with a preferred embodiment of the present invention comprises a housing component 10, a frame 20 mounting an LED 800 thereon and located in the housing component 10, a fastener 30 positioning the LED 800 thereon and coupled with the housing component 10, a heat spreader 40 located in and attached to the fastener 30 and a heat-transfer member having a heat pipe 50 and a heat-dissipating unit 60. The heat pipe 50 thermally connects the frame 20 with the heat-dissipating unit 60.

The housing component 10 is made of elastic plastic and has a cylindrical configuration. The housing component 10 comprises a cylindrical body 110. The body 110 has a top surface 120 on a front end portion thereof and a rear port (not labeled) opposite the front end portion. A round opening 122 is defined in a center of the top surface 120 for offering the LED 800 an exit so that the LED 800 is exposed over the top surface 120 of the body 110. Three elastic hooked portions 130 are extended from an edge of the rear end portion of the body 110 and are evenly spaced from each other along a circumference of the body 110. Each hooked portion 130 comprises a leg 132 extending from the edge of the rear end portion of the body 110 and a hook 134 extending inwardly from the leg 132 and having an acute angle with the leg 132. A plurality of poles 140 are formed on an inner surface of the top surface 120 of the body 110 and an internal thread 150 is defined in an inside around the circumference of the body 110.

The frame 20 has a round plate 200, such as a printed circuit board and the LED 800 is electrically connected on the frame 20 to emit light. The frame 20 comprises a top surface on which the LED 800 is mounted and a bottom surface opposite to the top surface. Three pins 210 are formed on the bottom surface of the frame 20. The three pins 210 comprise two conductive pins 210 and a nonconductive pin 210. The frame 20 is electrically connected to a power source via the two conductive pins 210.

The fastener 30 can be also made of elastic plastic and has a cylindrical configuration with two opposite ports thereof. The fastener 30 comprises a cylindrical body 300. Three positioning ears 310 and three latching portions 320 extend from edges of front and rear end portions of the body 300, respectively. The positioning ears 310 and the three latching portions 320 are evenly spaced along a circumference of the body 300. The three positioning ears 310 are located on a same plane and perpendicular to the body 300. Each positioning ear 310 has a triangular shape and defines a hole 312 adjacent to a right-angle corner thereof and corresponding to a corresponding pin 210 of the frame 20. Each latching portion 320 is curved towards an inside of the body 300 and comprises a leg 322 extending from the edge of the rear end of the body 300 and a fixed claw 324 extending from a tip of the leg 322 and having an acute angle to the leg 322. The latching portions 320 extend inwardly to define a range smaller than the circumference of the body 300. In the preferred embodiment of the present invention, the latching portions 320 are integrally formed with the body 300 by plastic injection molding and three cutouts 326 are defined in the edge of the rear end portion of the body 300 corresponding to the latching portions 320. An external thread 330 is defined in an outer surface around a circumference of the body 300 and located adjacent the front end portion of the body 300. The external thread 330 is located corresponding to the internal thread 150 in the body 110 of the housing component 10 for screwing in the internal thread 150 so as to secure the fastener 30 to the housing component 10.

Since the LED 800 inherently has a too small surface available to sufficiently transfer heat thereof, a heat transfer member has a great heat-transfer capability is chosen to transfer the heat to a large space to be dissipated out. The heat pipe 50 and the heat-dissipating unit 60 can satisfy this demand. Firstly, the heat spreader 40 is used to spread the heat from the LED 800. The heat spreader 40 can be made of aluminum or copper. The heat spreader 40 has a cylindrical body 400 with a hollow cylindrical portion in a center thereof. A circular passage 410 is defined through the center of the heat spreader 40. Three slots 420 are defined in an outer surface and along an axial direction of the body 400 of the heat spreader 40, corresponding to the latching portions 320 of the fastener 30. The three slots 420 divide the circumference of the body 400 into three equal parts.

The heat pipe 50 has an evaporating section 52 engaged in the passage 410 of the heat spreader 40, and a condensing section 54 perpendicular to the evaporating section 52 and inserted through the heat-dissipating unit 60. The heat-dissipating unit 60 comprises a plurality of metallic fins 62. The fins 62 are parallel to and separate from each other. A through hole (not labeled) is defined in a center of the heat-dissipating unit 60, transversely extending though all of the fins 62. The evaporating section 52 and the condensing section 54 of the heat pipe 50 are fixed in the passage 410 of the heat spreader 40 and the through hole of the heat-dissipating unit 60 by soldering, respectively, and the condensing section 54 of the heat pipe 50 is thermally engaged with the metallic fins 62. Furthermore, the heat pipe 50 can be engaged with the heat spreader 40 by soldering. The heat pipe 50 is preferably included to quickly transfer the heat from the LED 800 to the heat-dissipating unit 60 which can be arranged at a location remote from the LED 800 and can have a large heat-dissipating surface available to facilitate heat dissipation.

In assembly, the evaporating section 52 of the heat pipe 50 extends in the passage 410 of the heat spreader 40 by soldering and a front end of the evaporating section 52 projects out from the passage 410 to be attached to the rear surface of the frame 20 so as to absorb the heat from the LED 800 quickly. The latching portions 320 of the fastener 30 slide along the slots 420 of the heat spreader 40 until the fixed claws 324 of the latching portions 320 exert a spring force to clasp and resist on a bottom of the heat spreader 40. The fastener 30 surrounds an outside of the spreader 40 and is secured to the spreader 40. The pins 210 of the frame 20 are inserted into the holes 312 of the positioning ears 310 of the fastener 30 and the frame 20 is positioned on the front end portion of the fastener 30. Two wires (not shown) are soldered to two of the holes 312 whereby the two wires can electrically connect with the two conductive pins 210 when the two conductive pins 210 are inserted into the two corresponding holes 312. Thus, the two conductive pins 210, the round plate 200 and the LED 800 can electrically connect with the power source via the two wires. The nonconductive pin 210 and the other hole 312 are used as a polarization guide structure to make sure that the conductive pins 210 are properly inserted their respective holes 312 so that the LED 800 can be correctly energized. The housing component 10 covers the outside of the fastener 30 and is secured to the fastener 30 by the internal thread 150 in the housing component 10 screwing in the external thread 330 in the fastener 30. The hooks 134 of the hooked portions 130 of the housing components 10 exert a spring force to clasp and resist on the bottom of the heat spreader 40 so as to make the poles 140 on the top portion of the housing component 10 press the frame 20 to tightly attach to the fastener 30, and the frame 20 is thus tightly sandwiched between the housing component 10 and the fastener 30.

In operation, the evaporating section 52 of the heat pipe 50 absorbs the heat from the LED 800. A minor part of the heat is conducted to the heat spreader 40 by the evaporating section 52 of the heat pipe 50 and a major part of the heat is directly transferred to the fins 62 of the heat-dissipating unit 60; the heat from the LED 800 is thus be quickly removed to avoid a high temperature performance of the LED 800 and ensure that the LED 800 operates at a normal working temperature. Furthermore, the heat pipe 50 transfers the heat generated by the LED 800 to the heat-dissipating unit 60 which is located at a location remote from the LED 800 and can have a large heat-dissipating surface available to facilitate heat dissipation.

In the preferred embodiment of the present invention, the frame 20 is sandwiched between the housing component 10 and the fastener 30. The fastener 30 is disposed in the housing component 10 and the heat spreader 40 is located in the fastener 30 to be coupled as a unit, which is very advantageous in view of the compact size and portable requirement of heat dissipation devices with the LEDs.

It is believed that the present embodiments and their advantages will be understood from the foregoing description, and it will be apparent that various changes may be made thereto without departing from the spirit and scope of the invention or sacrificing all of its material advantages, the examples here described merely being preferred or exemplary embodiments of the invention.

What is claimed is:

1. An LED module comprising:
    a housing component;
    a frame disposed in the housing component;
    an LED electrically mounted on the frame;
    a fastener positioning the frame thereon and engaging with the housing component;
    a heat spreader enclosed by the fastener and spreading heat from the LED; and
    a heat-transfer member having a heat-dissipating unit remote from the frame and a heat pipe thermally connecting with the frame, the heat spreader and the heat-dissipating unit;
    wherein the fastener is located in the housing component and secured to the heat spreader and the frame is tightly sandwiched between the housing component and the fastener by the housing component pressing against the frame toward the fastener;
    wherein the fastener comprises a plurality of positioning ears extending from an end edge thereof and the frame comprises a plurality of pins engaging with the positioning ears of the fastener, the pins including at least two conductive pins and at least one nonconductive pin
    wherein the heat pipe has an evaporating section extending in the heat spreader and a condensing section inserted through the heat-dissipating unit;

wherein the heat spreader has a cylindrical configuration and defines a passage therein for accommodating the evaporating section of the heat pipe; and wherein a front end of the evaporating section projects out from the passage to be attached to a rear surface of the frame so as to absorb the heat from the LED.

2. The LED module as claimed in claim 1, wherein the housing component comprises a plurality of hooked portions extending from an end edge thereof and the hooked portions exert a spring force on the heat spreader to make the housing component tightly press the frame to be attached on the fastener.

3. The LED module as claimed in claim 1, wherein the housing component has a cylindrical configuration.

4. The LED module as claimed in claim 1, wherein the fastener comprises a plurality of elastic latching portions extending from an end edge thereof and the latching portions exert a spring force on the heat spreader to make the fastener tightly attached on the heat spreader.

5. The LED module as claimed in claim 4, wherein each latching portion comprises a fixed claw extending from the end edge thereof and the fixed claw is located in a manner such that it tightly engages a bottom of the heat spreader.

6. The LED module as claimed in claim 1, wherein the housing component comprises a plurality of poles pressing the frame on the fastener.

7. The LED module as claimed in claim 1, wherein the housing component defines an internal thread in a circumference thereof and an end portion of the fastener is secured in the internal thread.

8. The LED module as claimed in claim 7, wherein the fastener comprises an external thread in a circumference of the end portion thereof to screw in the internal thread of the housing component.

* * * * *